United States Patent [19]

Hoyte et al.

[11] Patent Number: 4,890,019

[45] Date of Patent: Dec. 26, 1989

[54] BILINGUAL CMOS TO ECL OUTPUT BUFFER

[75] Inventors: Lennox P. J. Hoyte, Brighton, Mass.; Christopher L. Houghton, Wallingford, Vt.

[73] Assignee: Digital Equipment Corporation

[21] Appl. No.: 246,991

[22] Filed: Sep. 20, 1988

[51] Int. Cl.$^4$ .................. H03K 19/092; H03K 17/16; H03K 19/094

[52] U.S. Cl. .................................... 307/475; 307/443; 307/448; 307/451

[58] Field of Search ................ 307/443, 448, 451, 475

[56] References Cited

U.S. PATENT DOCUMENTS

| | | | |
|---|---|---|---|
| 4,453,095 | 6/1984 | Wrathall | 307/475 |
| 4,538,076 | 8/1985 | Shimada | 307/475 |
| 4,563,601 | 1/1986 | Asano et al. | 307/475 |
| 4,704,549 | 11/1987 | Sanwo et al. | 307/475 |
| 4,739,193 | 4/1988 | Doty, II | 307/451 |
| 4,763,022 | 8/1988 | Sheldon | 307/475 |

Primary Examiner—Stanley D. Miller
Assistant Examiner—Margaret R. Wambach
Attorney, Agent, or Firm—Arnold, White & Durkee

[57] ABSTRACT

The present invention provides an output buffer that converts a standard CMOS signal from the (0, +5) volt domain into a standard ECL signal in the (−0.8, −1.6) volt domain. This buffer circuit may be included as a part of a CMOS integrated circuit. The overall CMOS chip operates in the standard CMOS voltage range, but the ECL output buffer produces output levels in the standard ECL range. The buffer uses a pair of CMOS transistors (e.g., p-channel devices formed in N-wells) with the wells in which they are formed grounded and an input transistor with the well in which it is formed set at $V_{DD}$ (+5V). The first "grounded-well" transistor responds to the state of the input transistor to switch the second grounded-well (output) transistor on or off. Depending on its state, the output transistor contributes current or not to a voltage divider to set the appropriate ECL voltage level at the output of the buffer.

15 Claims, 1 Drawing Sheet

BILINGUAL CMOS TO ECL OUTPUT BUFFER

BACKGROUND OF THE INVENTION

1. Field of the Invention

The present invention relates generally to the field of complementary symmetry MOS (CMOS) logic circuits and, more specifically, to an output buffer for converting CMOS logic signals to their equivalent emitter-coupled logic (ECL) voltage levels.

2. Background of the Invention

A CMOS circuit's logic level "1" approaches the power supply value which is generally three to five volts, while its logic level "0" is near the reference or ground level. On the other hand, an ECL circuit's logic level "1" is generally about $-0.8$ volts while its logic level "0" is generally about $-1.68$ volts. Therefore, some form of interface or buffer circuit must receive CMOS level signals and convert them to ECL level signals if CMOS logic is to communicate with ECL logic.

Such an interface or buffer circuit should contain only a few transistors. A circuit with few transistors minimizes the use of silicon area and minimizes propagation delays attributable to the circuit. The interface circuit should also maintain a relatively constant low output-impedance during the circuit's transition from one logic state to another. Further, correct ECL logic levels must be generated by the buffer despite variations in the CMOS process employed to make the buffer, variations in power supply voltages, and other variations such as changes in operating temperature.

A known buffer for converting CMOS logic levels to their corresponding ECL logic levels comprises transistors of opposite conductivity types and a saturation means responsive to a signal on an input terminal. This saturation means saturates a transistor in an "ON" state when the logic level "0" is applied to the input terminal. However, this known buffer circuit requires non-standard-voltage power supplies for operation.

It would therefore be advantageous to provide a buffer circuit that operates satisfactorily on standard CMOS and ECL power supply voltages. As used herein, the term "bilingual" refers to a capability of a circuit that converts one logic level (e.g., CMOS) to another logic level (e.g., ECL) using standard biasing voltages on the same substrate. Such a buffer should change state quickly to minimize propagation delays attributable to the buffer. It would further be advantageous to provide a CMOS to ECL buffer that provides reliable ECL signal voltage levels despite variations in the CMOS process, power supply voltages, and operating temperature.

SUMMARY OF THE INVENTION

Every CMOS process produces at least one type of 4-terminal MOS transistor. For example, an N-well process forms PMOS transistors inside diffused N-wells. These N-wells are normally connected to a constant voltage source, e.g., positive supply voltage. In an N-well process, the 4-terminal device therefore consists of the P-device source, drain, gate, and its N-well. For the standard CMOS part of the integrated circuit, the N-wells are all connected to the CMOS "high" supply, $V_{DD}$ (+5 V). However, for the output buffer of the present invention, the N-wells of two PMOS devices are connected to the CMOS/ECL reference voltage, $V_{SS}$, also known as Ground (0V). Thus, these two PMOS devices are "grounded-well" devices.

A "grounded-well" PMOS device will "turn-off" when the voltage at its gate rises above $0-V_{th}$, and will "turn on" when the voltage at its gate falls below 1 threshold voltage level under 0 volts. In other words, the "grounded-well" PMOS devices operate in the (0, $V_{EE}$) voltage range, where $V_{th}$ (the threshold voltage) is less than 0 but greater than $V_{EE}$.

In the present invention, CMOS logic signals are provided at the gate of a PMOS input transistor that is in an "ungrounded" well; that is, the transistor is biased b $V_{DD}$ in the conventional manner. Two "grounded-well" PMOS devices are connected to the drain of the input transistor. The source of the first "grounded-well" PMOS device is grounded and this PMOS device sets the voltage domain of operation for the second "grounded-well" PMOS device. The second "grounded-well" PMOS device is coupled to a voltage divider across the standard ECL power supply voltage. Thus, this "bilingual" voltage converter operates within standard CMOS and ECL power supply voltages on the same substrate. The voltage across one resistor of the voltage divider provides the ECL level voltage signals out of the buffer.

A high signal level at the input to the buffer turns off the input transistor. With the input transistor off, the voltage at the gate of the second "grounded-well" PMOS device is at a voltage level sufficiently negative to turn on this device. With the second "grounded-well" PMOS device conducting, a greater voltage drop is developed across one resistor of the voltage divider. The other resistor of the voltage divider provides the ECL output signals; thus, a high signal at the input to the buffer results in a high ECL level signal at the buffer output.

A low signal level at the input to the buffer turns on the input transistor. With the input transistor on, the second "grounded-well" PMOS device is off. This leaves more of $V_{EE}$ across the resistor of the voltage divider that provides the ECL output signals. Thus, a low signal level at the input to the buffer results in a low (more negative) ECL signal level at the buffer output.

The description and the FIGURE disclose further features and advantages of the present invention.

DETAILED DESCRIPTION OF A PREFERRED EMBODIMENT

Figure 1:
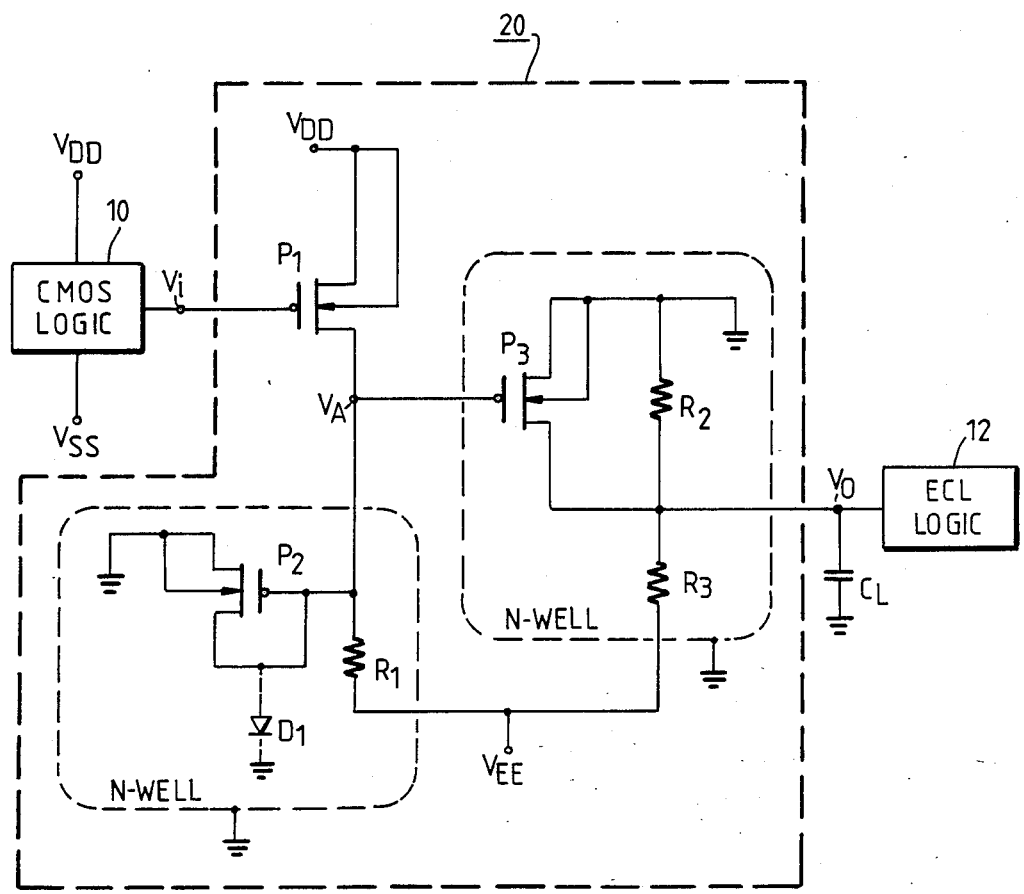
FIG. 1 is a circuit diagram depicting a CMOS to ECL buffer circuit of the present invention.

FIG. 1 depicts a CMOS to ECL buffer circuit 20 of the present invention. A CMOS logic circuit 10 provides CMOS logic-signal-level voltages. The CMOS to ECL buffer circuit 20 provides ECL logic-signal-level voltages to an ECL circuit 12.

The CMOS to ECL buffer circuit 20 contains three transistors, P1, P2, and P3. The buffer circuit 20 receives CMOS level logic signals from the CMOS logic circuit 10 via an input terminal $V_i$. A logical "1" may be represented by a voltage level of +5 volts at the input terminal $V_i$, and a logical "0" may be represented by a voltage of 0 volts.

The input terminal $V_i$ is coupled to the gate of the transistor P1, whose source is biased by the CMOS "high" power supply voltage, $V_{DD}$, which may be +5 volts. A node $V_A$ represents a point common to the drain of the transistor P1, the gates of the transistors P2 and P3, and one end of a resistor R1. The source of the transistor P2 is grounded (i.e., connected to the CMOS "low" or reference voltage supply $V_{SS}$), and the drain of the transistor P2 is coupled to its gate. The source of the transistor P3 is also grounded, and its drain is coupled to a voltage divider network R2, R3 and to an output terminal $V_o$. A capacitor $C_L$, as shown in FIG. 1, diagrammatically represents the capacitance present on the line that couples the buffer circuit 20 to the ECL circuit 12.

An ECL power supply $V_{EE}$ provides ECL logic level voltages via the voltage divider network R2,R3 as described below. The buffer circuit 20 is therefore "bilingual," operating with standard CMOS and ECL power supply voltages on the same substrate. The resistor R3 acts as a voltage "subtractor". That is, the output voltage (the voltage across R2) is equal to $V_{EE}$ less the voltage across R3. The greater the current through R3, the less negative the output voltage.

When the CMOS input level at $V_i$ is set to a logical "1", the transistor P1 is turned "off." Thus, transistor P1 serves as a switch means responsive to the logic state at the input terminal. $V_i$. With the transistor P1 "off," voltage division between the transistor P2 and a first resistor R1 determines the voltage level at the node $V_A$. Transistor P2 thus serves as a biasing means responsive to the state of transistor P1. The exact voltage at the node $V_A$ is a negative voltage level between ground and the ECL power supply voltage, $V_{EE}$, which may be $-5.2$ volts. This negative voltage level at the node $V_A$ is of a magnitude sufficient to "turn on" the transistor P3. The current supplied by P3 combines with that supplied by a second resistor R2 to elevate the voltage at the output terminal $V_o$ to the ECL "high" output level of about $-0.8$ volts. Transistor P3 thus serves as a current source and supplies current to the resistor R3.

When the CMOS input level at the input terminal $V_i$ is set to a logical "0" (0 V), the transistor P1 is turned "on", overwhelming the voltage divider network P2,R1 and elevating the voltage level at the node $V_A$ sufficiently to "turn off" the transistor P3. The voltage level at the output terminal $V_o$ is then determined solely by voltage division between the second resistor R2 and the third resistor R3. The values of the resistor R2 and R3 provide the ECL logical "0" level of about $-1.6$ volts, and, in a preferred embodiment, R2 is about 58 ohms and R3 is about 125 ohms. These resistance values and the parameters of the transistor P3 may be selected in the CMOS process to accommodate the input impedance of the ECL circuit 12.

As shown in FIG. 1, the N-wells in which the PMOS transistors P2 and P3 are formed are grounded. A diode D1 is shown diagrammatically to represent the P-N junction between the drain of the transistor P2 and its N-well. When this junction is forward biased, the voltage level at the node $V_A$ is limited to no more than a threshold voltage drop and is applied to the gate of the transistor P3. Also, in this state, the diode D1 conducts current into the well, and this current may be conducted to the integrated circuit chip epitaxial layer (circuit ground) using layout techniques commonly applied to I/O cell design.

A feature of the buffer of the present invention is the stability introduced into the ECL voltage levels. The ECL "low" voltage depends on the voltage division between the resistors R2 and R3 and is thus dependent only on the ECL supply, $V_{EE}$. The ECL "high" voltage depends on voltage supply levels as well as variations in the CMOS process that makes the buffer circuit and variations in operating temperature. Process tolerances and temperature variations cause the conductivity of the PMOS device to vary within a known range. If the P2 and P3 devices become more conductive, P2 will supply more current into the P2,R1 voltage divider, elevating the voltage at the node $V_A$. P3, with a higher conductivity, is thus "turned down" slightly, keeping a constant current contribution into the output divider network R2,R3.

A lower (more negative) ECL power supply voltage, $V_{EE}$, tends to lower the voltages at the node $V_A$ and at the output terminal $V_o$. The lower voltage at the node VA tends to "turn on" P3 harder to compensate by elevating the output voltage at the output terminal $V_o$. A higher (less negative $V_{EE}$ voltage tends to raise the voltage at the node $V_A$ and at the output terminal $V_o$. The higher voltage at the node $V_A$ tends to "turn down" P3, lowering the current into R3. Thus, the voltage across R2 provides a greater portion of the less negative $V_{EE}$ maintaining a stable ECL voltage level output.

Finally, variations in $V_{DD}$ have no significant effect on the ECL output levels because $V_{DD}$ is not a component of the ECL output structure.

The principles, preferred embodiments, and modes of operation of the present invention have been described in the foregoing specification. The invention is not to be construed as limited to the particular forms disclosed, because these are regarded as illustrative rather than restrictive. Moreover, variations and changes may be made by those skilled in the art without departing from the spirit of the invention. For example, the present invention was described as being embodied in PMOS devices in an N-well, but it will be apparent to those of skill in the art that the buffer circuit could also employ NMOS devices in a P-well.

What is claimed is:

1. A circuit for converting a first set of logic level signals to a second set of logic level signals comprising:
    a. an input terminal connectable to a source of said first set of logic level signals;
    b. an output terminal connectable to a device responsive to said second set of logic level signals;
    c. first and second power terminals for connection to first and second power supplies, respectively;
    d. a first transistor having first, second and gate terminals, said gate terminal connected to said input terminal, said first terminal connected to said first power terminal;
    e. a second transistor formed in a grounded well having first, second and gate terminals, said first terminal of said second transistor being grounded and said gate terminal and said second terminal of said second transistor being connected to said second terminal of said first transistor;
    f. a third transistor formed in a grounded well and having first, second and gate terminals, said gate terminal connected to said second terminal of said first transistor, said second terminal of said third transistor connected to said output terminal, said first terminal of said third transistor being grounded;
    g. a first resistor coupling said gate terminal of said second transistor to said second power supply;
    h. a second resistor coupling said second terminal of said third transistor to ground; and i. a third resistor coupling said second terminal of said third transistor to said second power supply.

2. A device for converting a first pair of logic-signal-voltage levels into a second pair of logic-signal voltage levels, comprising:
   a. output means and voltage subtractor means coupled in series;
   b. switch means having a first state in response to a logical "1" of the first pair of logic-signal-voltage levels and having a second state in response to a logical "0" of the first pair of logic-signal-voltage levels;
   c. biasing means responsive to the state of the switch means, the biasing means comprising a P-channel device formed in a grounded N-well;
   d. a current source responsive to said biasing means, the current source comprising a P-channel device formed in a grounded N-well; and
   e. means for conducting current from said current source to said voltage subtractor means.

3. A method of converting a first pair of logic-signal-voltage levels into a second pair of logic-signal-voltage levels comprising the steps of:
   a. impressing a potential across a series coupled output means and voltage subtractor means;
   b. a switching a switch means to a first state in response to a voltage representing a logical "1" of the first pair of logic-signal-voltage levels;
   c. activating a biasing means in response to said first state, the biasing means comprising a P-channel device formed in a grounded N-well;
   d. activating a current source in response to said biasing means to develop a current, the current source comprising a P-channel device formed in a grounded N-well;
   e. conducting the current from the current source to the voltage subtractor means yielding a voltage level across the output means representing a logical "1" of the second pair of logic-signal-voltage levels;
   f. switching the switch means to a second state in response to a voltage representing a logical "0" of the first pair of logic-signal-voltage levels;
   g. deactivating the biasing means in response to said second state; and
   h. deactivating the current source in response to said biasing means to remove the current-source current from the voltage subtractor means yielding a voltage level across the output means representing a logical "0" of the second pair of logic-signal-voltage levels.

4. A circuit according to claim 1 wherein said first power supply is positive and said second power supply is negative.

5. A circuit according to claim 1 wherein said first, second and third transistors are P-channel MOS transistors.

6. A circuit according to claim 1 wherein said first set of logic levels are CMOS logic levels, and said second set of logic levels are ECL logic levels.

7. A device according to claim 2 wherein said first pair of logic-signal-voltage levels are CMOS levels, and said second pair of logic-signal-voltage levels are ECL levels.

8. A method according to claim 3 wherein said first pair of logic-signal-voltage levels are CMOS levels, and said second pair of logic-signal-voltage levels are ECL levels.

9. A method according to claim 3 wherein said switch means and said current source both include P-channel MOS transistors.

10. A voltage converter circuit, comprising:
    (a) first, second and third transistors, each having a current path and a gate;
    (b) the current path of said first transistor being connected between a first power supply terminal and a sense node, the gate of said first transistor being an input node;
    (c) the current path of said second transistor being connected between said sense node and reference potential, and the gate of said second transistor being connected to said sense node;
    (d) first, second and third impedance elements, the first element being connected between said sense node and a second power supply terminal, the second and third elements being connected in series between said reference potential and said second power supply terminal with the juncture of said second and third elements in said series circuit being an output node;
    (e) the current path of said third transistor being connected between said juncture and said reference potential across said second element, and the gate of said third transistor being connected to said sense node.

11. A circuit according to claim 10 wherein said transistors are P-channel MOS transistors.

12. A circuit according to claim 10 wherein said first power supply terminal is connected to a positive voltage supply, and said second power supply terminal is connected to a negative voltage supply.

13. A circuit according to claim 10 wherein said impedance elements are resistors.

14. A circuit according to claim 12 wherein said transistors are P-channel MOS transistors and said second and third transistors have grounded N-wells.

15. A circuit according to claim 14 wherein said input node receives CMOS-level logic voltages and said output node exhibits ECL-level logic voltages in response thereto.

* * * * *